United States Patent [19]

Tsukada et al.

[11] 4,360,821

[45] Nov. 23, 1982

[54] SOLID-STATE IMAGING DEVICE

[75] Inventors: Toshihisa Tsukada, Tokyo; Eiichi Maruyama, Kodaira; Toru Baji, Kokubunji; Saburo Ataka, Tokyo; Yoshinori Imamura, Hachioji; Akira Sasano, Tokyo; Masaharu Kubo, Hachioji; Norio Koike, Tokyo; Shusaku Nagahara, Hachioji, all of Japan

[73] Assignee: Hitachi, Ltd., Tokyo, Japan

[21] Appl. No.: 66,230

[22] Filed: Aug. 13, 1979

[30] Foreign Application Priority Data

Aug. 18, 1978 [JP] Japan .............................. 53/100060
Jul. 27, 1979 [JP] Japan .......................... 54/103031[U]

[51] Int. Cl.³ .......................................... H01L 27/14
[52] U.S. Cl. .......................................... 357/31; 357/2; 357/4; 357/24; 357/30
[58] Field of Search ................. 357/2, 4, 30, 31, 24, 357/32

[56] References Cited

U.S. PATENT DOCUMENTS

| 3,699,375 | 10/1972 | Weibel | 313/95 |
|---|---|---|---|
| 4,064,521 | 12/1977 | Carlson | 357/2 |
| 4,069,492 | 1/1978 | Pankove | 357/17 |
| 4,117,506 | 9/1978 | Carlson | 357/30 |
| 4,143,389 | 3/1979 | Koike | 357/31 |
| 4,147,667 | 4/1979 | Chevallier | 252/501 |
| 4,155,006 | 5/1979 | Sato | 357/32 X |
| 4,190,851 | 2/1980 | Finnila | 357/24 X |
| 4,202,928 | 5/1980 | Staebler | 428/446 |
| 4,209,806 | 6/1980 | Koike | 357/30 |

OTHER PUBLICATIONS

Imamura, et al., *App. Phys. Lett.* 35 (4), Aug. 15, 1979.

*Primary Examiner*—Martin H. Edlow
*Attorney, Agent, or Firm*—Antonelli, Terry & Wands

[57] ABSTRACT

In a solid-state imaging device having a plurality of photosensitive portions and a semiconductor substrate which includes at least scanning means for scanning the photosensitive portions, the photosensitive portions including a layer of a photosensitive material overlying the semiconductor substrate and a transparent electrically conductive film overlying the photosensitive material layer; a solid-state imaging device characterized in that the photosensitive material is an amorphous material whose indispensable constituent is silicon and which contains hydrogen. The hydrogen content of the photosensitive material is preferably 5 atomic-% to 30 atomic-%, especially 10 atomic-% to 25 atomic-%.

11 Claims, 18 Drawing Figures

SOLID-STATE IMAGING DEVICE

BACKGROUND OF THE INVENTION

1. Field of the Invention

This invention relates to improvements in a photosensor or solid-state imaging device which is fabricated on a semiconductor single-crystal substrate.

2. Description of the Prior Art

As an imaging device, there has heretofore been employed an image pickup tube of the type in which a photoconductive target operating in the storage mode is scanned with an electron beam. In this case, the use of the electron beam leads to such difficulties such as the requirement of a high voltage and the need for miniaturization. It is a solid-state imaging device or imaging plate that has been devised in order to overcome these difficulties.

FIG. 1 illustrates the principle of a solid-state imaging device. Picture elements 4 are arranged in a checkered pattern, and signals kept in the picture elements are read out by the XY-address system one by one. The respective picture elements are selected i.e., scanned by a horizontal scan signal generator 1 and a vertical scan signal generator 2. Numeral 3 indicates a swich connected electrically to the picture elements, and numeral 5 an output terminal.

As the concrete construction of a photosensitive region for the picture element, there are an example in which a diffused region is directly formed in a Si substrate, and an example which utilizes a photoconductive thin film, etc.

In the example in which the photosensitive region is constructed by forming the diffused region in the Si substrate, each picture element corresponds to the source region of a MOS switch. Since the MOS FET switches which are arrayed in two dimensions occupy a considerable area, this example is not advisable for the construction of the photosensitive devices.

Interconnections running in the vertical and horizontal directions occupy the surface of the sensor, and reduce the effective photosensitive area. These interconnections cause a lowering of the photosensitivity and diminish the signal output, and therefore form a cause for degrading the signal-to-noise ratio (SN ratio).

On the other hand, in the example which utilizes the photoconductive thin film, scanning circuits for the XY-addressing made of the MOS FET switches, etc. are formed on an Si substrate, and the photoconductive thin film is deposited over the scanning circuits so as to provide the light receiving portions. Such examples of the solid-state imaging devices are disclosed in Japanese Laid-open Patent Application No. 95720/1976, etc. FIG. 2 shows a sectional view for explaining the principle of such devices. In an Si substrate 6, diffused regions 7 and 8 are provided as the source and drain of a MOS swi5tch. Numeral 10 designates a gate electrode of the MOS switch, numeral 15 a drain electrode for leading out a signal, and numeral 16 a source electrode. A photoconductive thin film 17 and a transparent electrode 18 are formed over the switching circuit thus constructed. An insulator layer is designated by reference numeral 13.

A capacitance C is formed between an electrode 16 (area S) and the transparent conductive film 18 with the intervention of the photoconductive thin film 17 which is made of a substance exhibiting photoconductivity, for example, $Sb_2S_3$, CdS, $As_2Se_3$ or polycrystalline Si. Since the electrode pattern is set in the form of a matrix, equivalent capacitors are arranged in the form of a matrix. Since the capacitor includes the photoconductive film therein, it functions as a photosensitive element and forms a picture element. The photosensitive element has its equivalent circuit expressed by a parallel connection consisting of the capacitance C and a variable resistance R the electric resistance of which varies in response to the intensity of light.

The magnitude of the capacitance C is determined by the electrode area S, the thickness t and dielectric constant $\epsilon$ of the photoconductive thin film 17, and is expressed as $C = \epsilon \cdot S/t$. The magnitude of the resistance is inversely proportional to the intensity of light incident upon the electrode face at the particular position. In case where no light strikes, the resistance is regarded as $R \approx \infty$ though it is also dependent upon the nature of the photoconductive thin film.

A target voltage ($V_T$) is applied to the transparent electrode 18, and the capacitor upon which no light impinges during one field period holds the voltage $V_T$ unchanged. In a part of the conductive film upon which light impinges, the resistance R decreases in proportion to the intensity of the light, so that charges stored in the capacitance C are discharged and so that the voltage held in the capacitor decreases in proportion to the quantity of light. Letting $U_T$ denote the voltage left after the discharge in one field period, a charging current corresponding to a voltage $V_T - U_T$ flows. Upon completion of the charging, the capacitor is recharged to the target voltage again. The charging current at this time becomes a video signal which corresponds to this field.

In such solid-state imaging device, imaging characteristics such as spectral response, resolution, SN ratio, and lag characteristics are naturally important. Also important are the stability against temperature change, etc. of the photoconductive thin film. More specifically, the transparent electrode needs to be deposited after forming the photoconductive thin film on the Si body. In this case, the substrate needs to be heated to 400°–500° C. when $SnO_2$ (Sn Nesa) is employed for the transparent electrode, and it needs to be heated to approximately 250° C. even when In Nesa is employed therefor. This is the reason why the stability against temperature change of the photoconductive film is required. The transparent electrode may well be replaced with a semitransparent metal thin film, with which the heating of the substrate is unnecessary. On account of reflection and absorption of light by the metal thin film, however, the photo response which is important in the imaging characteristics is lowered noticeably. This is especially problematic in the imaging device of the structure shown in FIG. 2. In the imaging target of a conventional image pickup tube, a Nesa electrode is formed on a glass faceplate, whereupon a photoconductive film is deposited. Therefore, whether or not the photoconductive film is resistant against temperature change is not a problem at least in the manufacturing process.

The mechanical strength is also important. After depositing the photoconductive thin film, the operations of providing the Nesa electrode and further providing filters etc. in case of a color imaging plate are necessary, so that the mechanical strength is required from the viewpoint of easy handling.

It is required of the photoconductive thin film that the resistivity of the photoconductive thin film is at least $10^{10}$ Ω·cm. This is because a charge pattern must not disappear due to diffusion within a time interval in which a specified picture element is scanned, i.e., a storage time.

When polycrystalline Si is employed for the photoconductive thin film, particularly the resistivity is low, and the film needs to be split into a mosaic pattern. This renders the process complicated, and simultaneously lowers the available percentage.

A photoconductive thin film made of $Sb_2S_3$, $As_2Se_3$ or the like has problems in its mechanical strength and its thermal stability, and has been practically unsuitable for use in the imaging device of the structure shown in FIG. 2.

This invention solves the heretofore described difficulties.

The applicant has filed a patent application (Ser. No. 39,580, filed on May 16, 1979) with the U.S. Patent and Trademark Office in relation to the photosensitive face of an image pickup tube etc. employing a photoconductive film made of an amorphous material whose principal constituent is silicon and which contains hydrogen. Also pending in the U.S. Patent and Trademark Office is a patent application (Ser. No. 48,740 filed on June 15, 1979) concerning a photoconductive material whose principal constituent is silicon and which contains hydrogen and carbon and/or germanium.

SUMMARY OF THE INVENTION

A solid-state imaging device having a plurality of photosesitive regions and a semiconductor substrate which includes at least scanning means for selecting the photosensitive regions in succession, the photoelectric portions including at least a layer of a photoelectric material over the semiconductor substrate and a transparent conductive film over the photoelectric material layer, characterized in that the photoelectric material is an amorphous material whose indispensable constituent element is silicon and which contains hydrogen, is disclosed. The hydrogen content of the photoelectric material should preferably be 5 atomic-% to 30 atomic-%, and especially preferably be 10 atomic-% to 25 atomic-%.

DETAILED DESCRIPTION OF THE PREFERRED EMBODIMENTS

Figure 1:
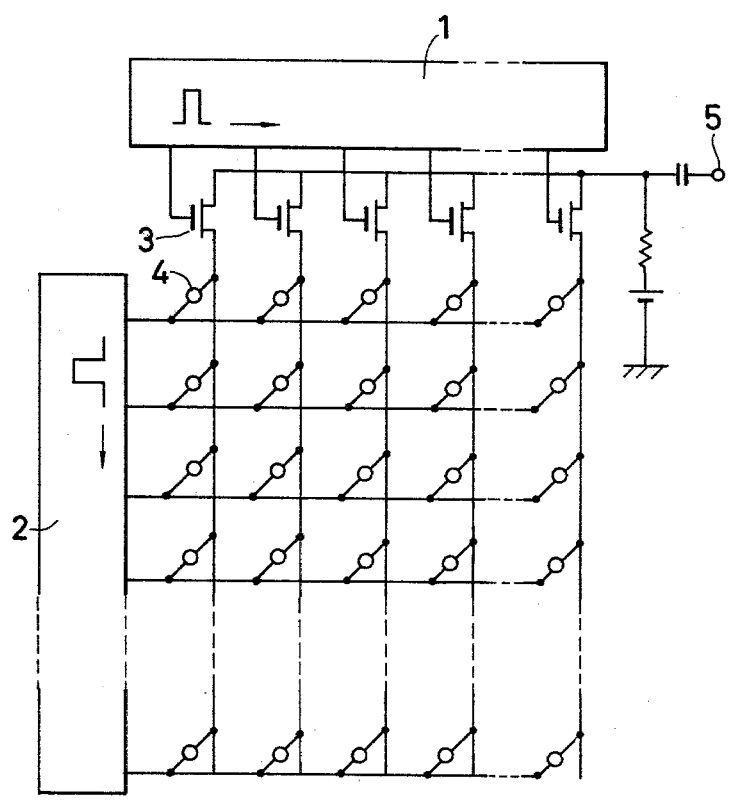
FIG. 1 is a diagram showing the principle of a solid-state imaging device.
Figure 2:
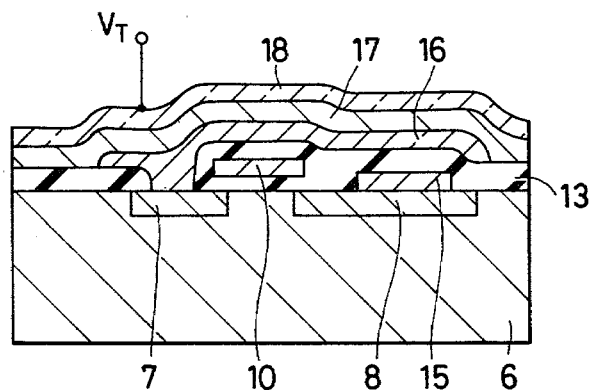
FIG. 2 is a sectional view of a picture element portion of a solid-state imaging device which employs a photoconductive thin film.

The fundamental structure of this invention is similar to the structure shown in FIG. 2, and comprises at least a Si substrate having scanning circuits etc. and a photoconductive thin layer over said Si substrate.

Specifically, the feature of this invention resides in that an amorphous material whose indispensable constituent element is silicon and which contains hydrogen is employed for the photoconductive thin film. Particularly, an amorphous material which contains at least 50 atomic-% of silicon and 5 atomic-% to 50 atomic-% of hydrogen is used. As the hydrogen content, a value of 5 atomic-% to 30 atomic-% is preferable, and a value of 10 atomic-% to 25 atomic-% is more preferable. In this case, a part of the silicon in the amorphous material can be substituted by at least one of germanium and carbon which belong to the same group of the elements the periodical table that of the silicon. As to the quantity of substitution, at most 30% with respect to the quantity of silicon is especially useful.

The film is used with a thickness of at least 0.05 μm. In practical use, a value of 0.2 μm–4 μm is often employed. A value of 1 μm–4 μm is more preferable. The thin film may well be a multiple layer or have its composition varied continuously. The amorphous film which contains both silicon and hydrogen in this manner is an excellent material which can be easily brought into a high resistivity of at least $10^{10}$ Ω·cm and which has a very small number of trap levels hampering the transit of carriers. Detailed characteristics will be explained in the hereinafter described examples.

The photoconductive material of this invention can be manufactured by various methods. Hereunder, typical examples will be described.

Figure 3:
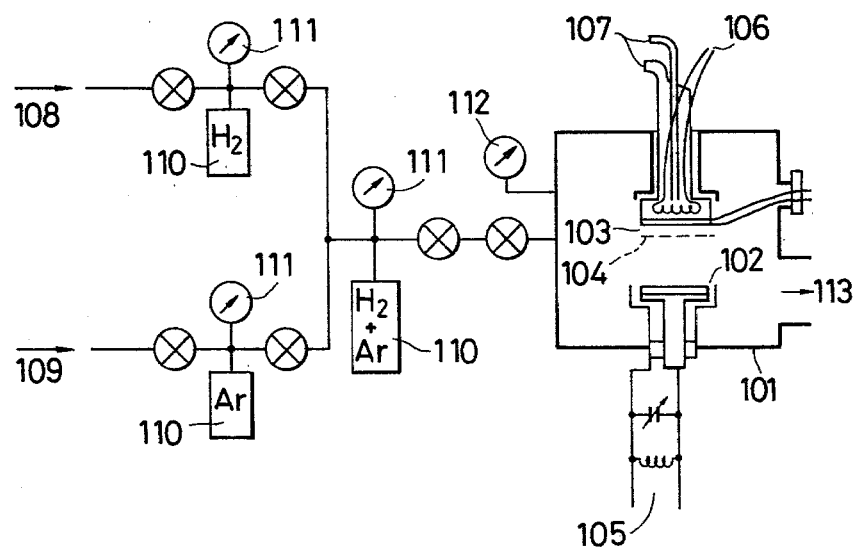
FIG. 3 is an explanatory view of a reactive sputtering equipment.

The first method is the reactive sputtering. FIG. 3 shows a model diagram of an equipment for the reactive sputtering. The equipment itself is a conventional sputtering apparatus. Numeral 101 designates a vessel which can be evacuated to a vacuum, numeral 102 a sputter target, numeral 103 a sample substrate, numeral 104 a shutter, numeral 105 an input from a sputtering radio-frequency oscillator, numeral 106 a heater for heating the substrate, numeral 107 a water cooling pipe for cooling the substrate, numeral 108 a port for introducing high-purity hydrogen, numeral 109 a port for introducing a gas such as argon, numeral 110 a gas reservoir, numeral 111 a pressure gauge, numeral 112 a vacuum gauge, and numeral 113 a port for connection to an evacuating system.

The target for sputtering may be one cut out of fused silica. In case of an amorphous material which contains silicon and germanium and/or carbon, a target which contains these three group-IV elements in combination is used. In this case, it is convenient by way of example to place a slice of graphite, germanium or the like on a substrate of silicon and to use the resultant structure as the target. The composition of the amorphous material can be controlled by properly selecting the area ratio between silicon and germanium and/or carbon. Of course, it is also allowed by way of example to dispose a slice of silicon on a substrate of carbon inversely. Further, a target may well be constructed by juxtaposing both the materials or by employing melts of the constituents.

By employing as the sputtering target Si which contains, for example, phosporus (P), arsenic (As), boron (B), gallium (Ga), antimony (Sb), indium (In) and/or bismuth (Bi) in advance, the photoconductive material can be doped with these elements as impurity elements. With this method, amorphous materials of any desired conductivity types such as n-type and p-type can be obtained. In case of obtaining a material of high resistivity, an impurity density of at most 0.1 atomic-% is employed in practical use. This is the same as in techniques ordinarily used in the field of semiconductor materials. Such impurity-doping also makes it possible to vary the resistance value of the material. A high resistivity on the order of $10^{13}$ Ω·cm can be realized. Regarding the dark resistivity, a value of $10^{15}$ Ω·cm will be the upper limit in practical use. The impurity-doping may well be carried out by a method in which diborane or phosphine is mixed in rare gas. It is sometimes the case that, in the course of the manufacturing process, the amorphous material is doped with a very small quantity of oxygen as an impurity.

Using the equipment as stated above, in an Ar atmosphere containing hydrogen ($H_2$) at any of various mixing ratios of at most 30 mol-%, radio-frequency discharge is generated to sputter Si and graphite and to deposit them on the substrate. Thus, a thin layer can be obtained. In this case, the pressure of the Ar atmosphere containing hydrogen may be any value within a range in which the glow discharge can be maintained, and it is usually 0.001–1.0 Torr or so. In case of 0.1–1.0 Torr, the discharge is especially stable. It is favorable to select the temperature of the sample substrate in a range of from the room temperature to 300° C. A temperature of 150°–250° C. is the most practical. This is because at too low temperatures, the amorphous material is not conveniently doped with hydrogen, and at too high temperatures, hydrogen trends to be emitted from the amorphous material contrariwise. The hydrogen content is controlled by controlling the partial pressure of hydrogen in the Ar atmosphere. In case where the quantity of hydrogen in the atmosphere is made 5–7 mol-%, a content of approximately 30 atomic-% can be realized in the amorphous material. As to other compositions, the partial pressures of hydrogen may be set with the rough aim at this proportion. In order to estimate the hydrogen percentages in the materials, the evolved hydrogen gas from the heated sample was measured.

Ar of the atmosphere can be replaced with another rare gas such as Kr.

In obtaining a film of high resistivity, a low-temperature and high-speed sputtering equipment of the magnetron type is favorable.

The second method for manufacturing the amorphous material of this invention is a process which resorts to the glow discharge. The amorphous material is formed in such a way that the glow discharge of $SiH_4$ is carried out to decompose this gas into Si and hydrogen and to deposit them on the substrate. In case of an amorphous material containing Si and C, a mixture gas consisting of $SiH_4$ and $CH_4$ may be employed. In this case, the pressure of the mixed gas of $SiH_4$ and $CH_4$ is held between 0.1–5 Torr. The glow discharge may be established by either the D.C. bias method or the radio-frequency discharge method. The proportion of Si and C can be controlled by varying the ratios of the gases $SiH_4$ and $CH_4$ to be mixed. In order to obtain an amorphous material of good quality, the substrate temperature needs to be kept at 200° C.–400° C.

An amorphous material of the p-type or the n-type can be prepared in such a way that $B_2H_6$ or $PH_3$, for example, is added to the mixture gas of $SiH_4$ and $CH_4$ 0.1–1% (in the volumetric ratio) respectively. The amorphous film of this invention can also be produced by the electron beam evaporation in an atmosphere containing $H_2$.

When a film of a photoelectric material is formed directly on a semiconductor body in which scanning circuits including, for example, MOS transistor portions, etc. are formed on a semiconductor substrate, the unevenness of the surface of the semiconductor body appears in this film. When the film of the photoelectric material is thin, a stepped disconnection due to the unevenness of the film surface might possibly take place. Therefore, a insulator may well be buried in a concave part of the semiconductor body. In this way, the surface of which the photoelectric material layer is to be formed is flattened. At least Part of a source electrode (drain electrode) is exposed, and the photoconductive film is formed thereon. Of course, other necessary parts are provided with openings. As the insulator, a heat-resistive polymer resin such as polyimide, polyimide-iso-hydroquinazolinedione and polyamide-imide or an inorganic substrate such as spin-on-glass is useful.

EXAMPLE 1

Figure 4:
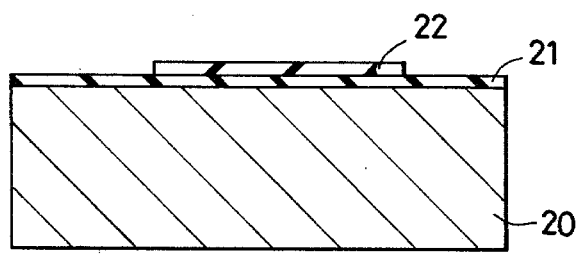
FIGS. 4 to 10 are sectional views of a device showing a process for manufacturing a solid-state imaging device of this invention.
Figure 5:
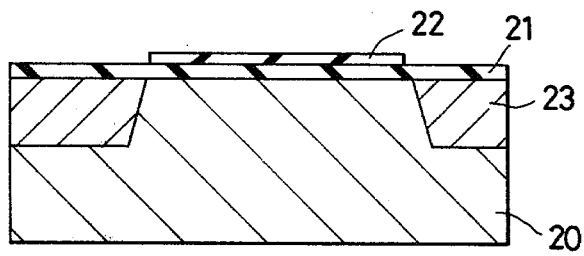
Figure 6:
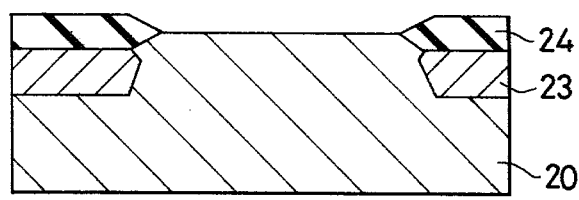
Figure 7:
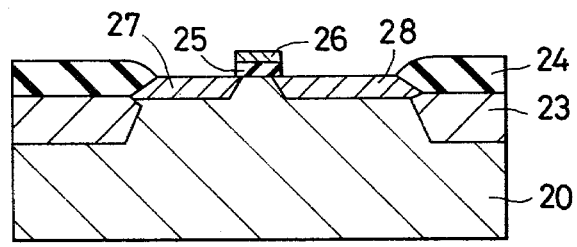
Figure 8:
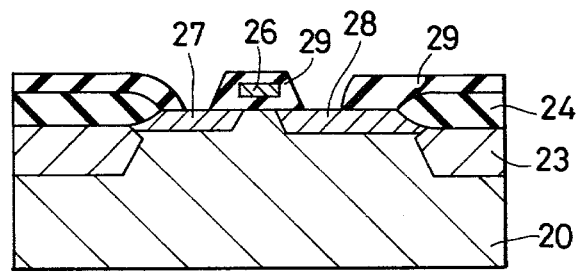
Figure 9:
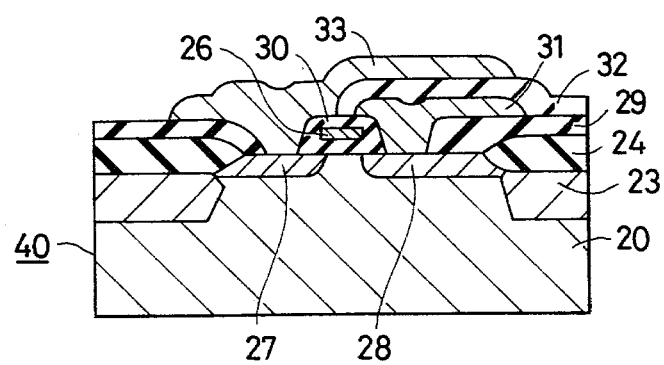

FIGS. 4 to 10 are sectional views of a deviceshowing a process for manufacturing the solid-state imaging device of this invention. A scanning circuit portion including switching circuits, etc. to be formed in a semiconductor substrate are manufactured by the use of a process for a conventional semiconductor device. As shown in FIG. 4, a thin $SiO_2$ film 21 of approximately 800 Å was formed on a p-type silicon substrate 20, and an $Si_3N_4$ film 22 of approximately 1,400 Å was formed on a predetermined position of the $SiO_2$ film. The $SiO_2$ film was formed by the conventional CVD process, and the $Si_3N_4$ film by a CVD process in which $Si_3N_4$, $NH_4$ and $N_2$ were caused to flow. A p-type diffused region 23 was formed on the silicon substrate by using the ion implantation technique. FIG. 5 shows this state. The diffused region 23 was disposed in order to isolate individual elements. Subsequently, silicon was locally oxidized in an atmosphere of $H_2:O_2=1:8$, to form an $SiO_2$ layer 24 (FIG. 6). This method is the local oxidation of silicon for the element isolation as is usually termed LOCOS. After removing the $Si_3N_4$ film 22 and the $SiO_2$ film 21, a gate insulating film 25 for a MOS transistor was formed of an $SiO_2$ film. Subsequently, a gate portion 26 made of poly-silicion and diffused regions 27 and 28 were formed (FIG. 7). Further, an $SiO_2$ film 29 was formed on the resultant substrate. Electrode lead-out ports for the source 27 and the drain 28 were provided in this film by etching (FIG. 8). An aluminum layer 8,000 Å thick was evaporated as a drain electrode (or source electrode) 31. Further, an $SiO_2$ film 32 (7,500 Å thick) was formed, whereupon an Al layer 1 μm thick was evaporated as a source electrode (or drain electrode) 33. FIG. 9 is a sectional view showing this state. The electrode 33 was formed extensively in a manner to cover the regions 27, 28 and the gate portion. This is because undesirable blooming phenomena take place, when light enters the signal processing region among the diffused layers 23 for isolating the elements.

Figure 11:
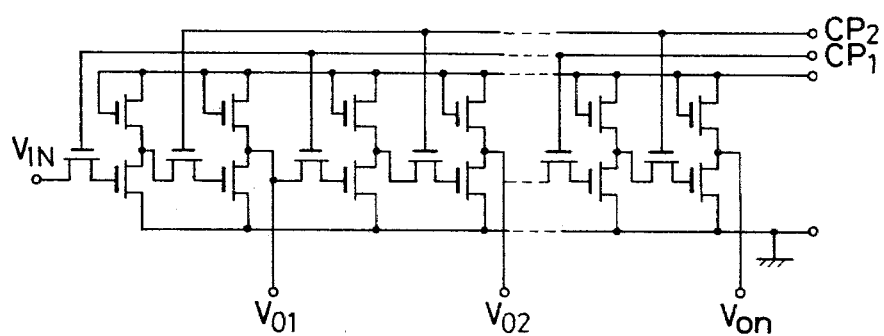
FIG. 11 is a diagram showing an example of a shift register.

A shift register portion which is arranged in the periphery of the device may have an ordinary construction as shown by way of example in FIG. 11.

Figure 12:
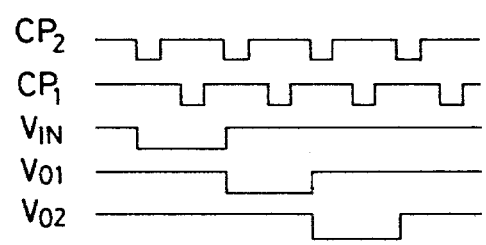
FIG. 12 is a diagram showing the operating timings of the shift register.

This example is a two-phase dynamic shift register composed of a pair of inverter circuits and a pair of delay circuits, and it achieves a stable operation irrespective of the phases of clock pulses for shifting scan pulses. When a start pulse $V_{IN}$ is applied, sequential shift pulses $V_{01}$, $V_{02}$ . . . synchronous with the clock pulses $CP_2$ are delivered from respective bit terminals. FIG. 12 illustrates the timings of this operation.

Needless to say, the concrete circuit arrangement of the shift register is not restricted to the illustrated one. In this way, the MOS transistor portion of the scanning circuit is completed.

Figure 13:
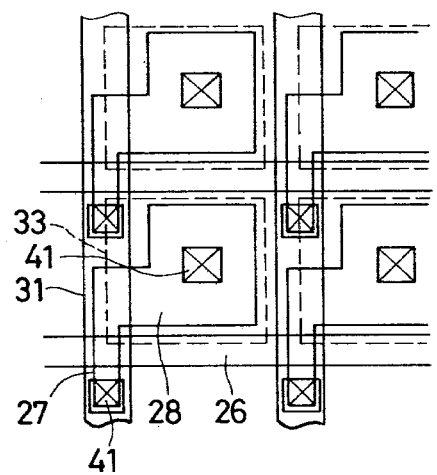
FIG. 13 is a plan view of a solid-state imaging device of an embodiment.

FIG. 13 shows a plan view of an Si body portion. Respective numerals in the figure correspond to those in the sectional views referred to above. Numeral 41 indicates a contact hole for the electrode.

Figure 10:
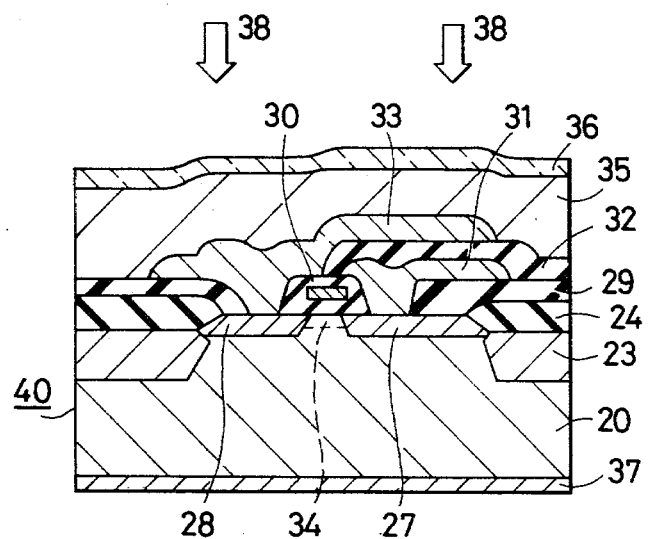

Subsequently, the semiconductor body 40 prepared by the above steps was attached to a magnetron type sputtering equipment. The equipment was the same as shown in FIG. 3. The atmosphere was a gas mixture consisting of Ar and hydrogen, and was under 0.2 Torr. The hydrogen content was 6 mol-%. The sputter target was made of silicon. The reactive sputtering was carried out under conditions of a frequency of 13.56 MHz and an input of 300 W, to deposit an amorphous silicon thin film 35 containing hydrogen on the semiconductor body 40 to a thickness of 500 nm (FIG. 10). The hydrogen content of the amorphous thin film was 20 atomic-%, and the resistivity thereof was $5 \times 10^{13}$ $\Omega$·cm.

A first electrode 36 needs to be disposed on the amorphous silicon thin film 35. The first electrode serves to apply a bias voltage. Now, light needs to enter from above, and this electrode should therefore be made to be transparent. A Nesa electrode made of $In_2O_3$ was employed because the deposition temperature of $In_2O_3$ is not harmful for the amorphous silicon. On that part of the Nesa electrode which was not the light receiving portion, Cr-Au was deposited by the mask evaporation to form a bias electrode, and a wire bonded here. A second electrode 37 such a Au film was formed on the rear surface of the semiconductor body. Thus, the solid-state imaging device was completed.

Numeral 38 in FIG. 10 indicates incident light.

The solid-state imaging device fabricated by the method stated above makes it possible to obtain a good picture free from the blooming.

Figure 14:
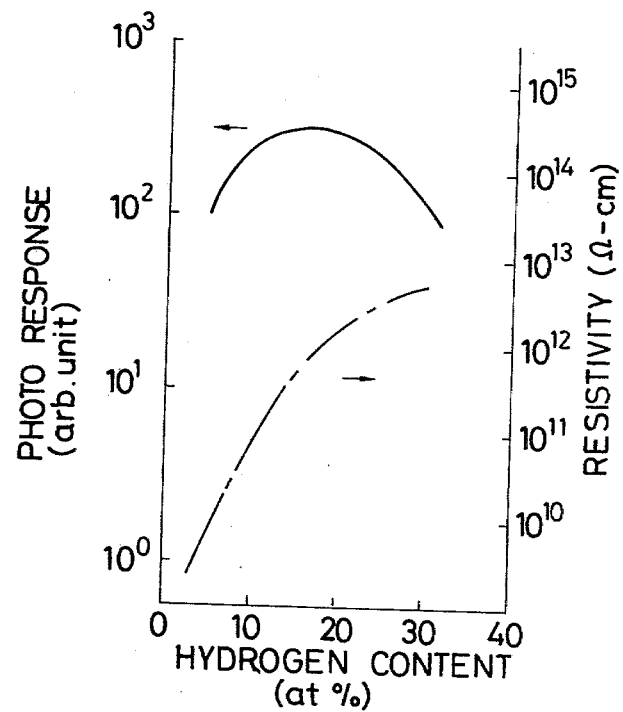
FIG. 14 is a graph showing the relationship between the hydrogen content of a photoconductive material and the photo-response as well as the resistivity thereof.

FIG. 14 shows a result which was obtained by varying the quantity of hydrogen contained in the amorphous silicon thin film 35 and measuring the photo response of the thin film. A solid line indicates a curve representative of the characteristic. In the measurement of the photo response, a tungsten lamp was used as a source of light. FIG. 14 simultaneously shows a variation in the resistivity As a function of the quantity of hydrogen contained in the amorphous silicon. A one-dot chain line indicates a curve representative of this characteristic.

It is understood from the characteristic of FIG. 14 that a value of 5 atomic-% to 30 atomic-%, especially 10 atomic-% to 25 atomic-%, is preferable as the hydrogen concentration in the amorphous silicon film. Further, when the hydrogen concentration is below 5 atomic-%, the resistivity becomes lower than $10^{10}$ $\Omega$·cm. Also from this point, it is understood that a too low content of hydrogen is not favorable.

EXAMPLE 2

Using materials listed in Table 1 for photoconductive thin films, solid-state imaging devices were manufactured. Manufacturing procedures were the same as explained in Example 1.

TABLE 1

| Sample No. | Amorphous material | Resistivity ($\Omega$·cm) | Manufacturing Condition |
|---|---|---|---|
| 1 | $Si_{0.8}H_{0.2}$ | $5 \times 10^{13}$ | discharge power: 300 W, substrate temp.: 250° C. |
| 3 | $Si_{0.85}H_{0.15}$ | $10^{13}$ | discharge power: 300 W, substrate temp.: 250° C. |
| 4 | $Si_{0.69}C_{0.01}H_{0.3}$ | $3 \times 10^{12}$ | area ratio between Si and C in target = 95:5 |
| 5 | $Si_{0.5}C_{0.2}H_{0.3}$ | $10^{12}$ | area ratio between Si and C in target = 40:60 |
| 6 | $Si_{0.75}Ge_{0.05}H_{0.2}$ | $2 \times 10^{12}$ | area ratio between Si and Ge in target = 95:5 |
| 7 | $Si_{0.6}Ge_{0.1}H_{0.3}$ | $10^{12}$ | area ratio between Si and Ge in target = 80:20 |
| 8 | $Si_{0.7}Ge_{0.05}C_{0.05}H_{0.2}$ | $10^{12}$ | area ratio among Si and C and Ge = 80:10:10 |

By employing the following construction for the photoconductive thin film, the spectral response can be improved. First, an amorphous silicon film 1 $\mu$m thick containing 25 atomic-% of hydrogen was deposited. Subsequently, layers of an amorphous material consisting of 20 atomic-% of hydrogen, 20 atomic-% of germanium and 60 atomic-% of silicon and an amorphous material consisting of 20 atomic-% of hydrogen, 30 atomic-% of carbon and 50 atomic-% of silicon were stacked 0.5$\mu$ respectively. The method of formation was the reactive sputtering described heretofore. Further, the resultant film was put in a vacuum evaporation equipment, and $CeO_2$ was evaporated thereon to a thickness of 10 nm by the resistance heating. Lastly, gold was evaporated to a thickness of 25 nm. At this extent of thickness, even gold can have its light transmission factor of 60% or higher and can bring forth a satisfactory light intensity.

Favorable results were obtained even when $SiO_2$, $TiO_2$ etc. were deposited in lieu of $CeO_2$ in the above example. The thicknesses of these films were made 100 Å–300 Å.

EXAMPLE 3

As in Example 1, a shift register employing MOS transistors and switching MOSFETs were manufactured on an n-type silicon substrate. The fundamental structure was the same as in Example 1. Since, however, the substrate was of the n-type, the transistors were constructed in the p-type channel. This may conform with a well-known process for fabricating a semiconductor IC.

On an Si body thus provided with scanning circuitry, amorphous silicon containing hydrogen was deposited by the method resorting to the glow discharge. The discharge atmosphere was $SiH_4$ under 1.5 Torr. With the body heated to 500° C., an amorphous material was deposited at an r.f. input frequency of 0.5 MHz, under a pressure of 1.0 Torr and at a substrate temperature of 300° C. The film thickness of the amorphous material was 2 $\mu$m, and the resistivity thereof was $1 \times 10^{12}$ $\Omega$·cm. On the amorphous material, a Nesa electrode was formed of In$_2$O$_3$. Then, the solid-state imaging device was completed.

EXAMPLE 4

An example will be described in which a desired insulator was buried in an uneven part on a semiconductor body so as to form a flat surface, whereupon a photoconductive film was formed thereon.

As in Example 1, scanning means including switching circuits, etc. were formed on a semiconductor substrate (refer to FIG. 9).

Figure 15:
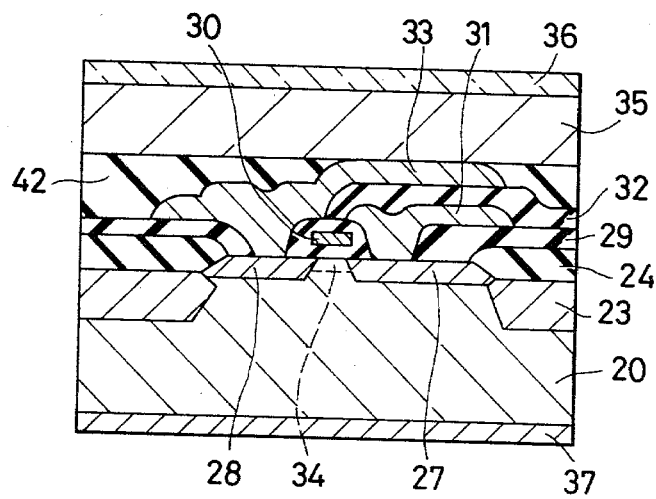
FIG. 15 is a sectional view of a device showing another embodiment of this invention.

Subsequently, a film (42 in FIG. 15) of polyimideisoindroquinazolinedione being a heat-resistive polymer resin was formed to a thickness of 1.0μ. The resin film could be formed by applying a solution of the resin onto the substrate on a rotating disk and then hardening it.

Subsequently, in order to expose at least part of the electrode (33), the resin film was etched by using a photolithographic technique. It is advisable that openings including the lead-out port of the electrode 31, etc. are formed simultaneously by this step. As in Example 1, the amorphous material 35 was deposited on the resultant structure, and the transparent electrode 36 was further formed. Since the uneven part of the surface of the semiconductor body was flattened by the heat-resistive polymer resin, the formation of the film of the amorphous material 35 as well as the transparent electrode 36 was much facilitated.

EXAMPLE 5

Figure 16:
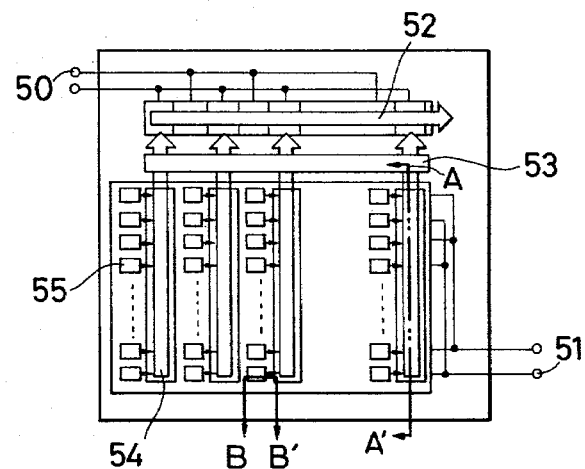
FIG. 16 is an explanatory view of an embodiment which employs a CCD (charge coupled device) for a scanning circuit.

This example employed a CCD (charge coupled device) transfer region as a scanning circuit. FIG. 16 shows an explanatory plan view of the arrangement of various constituents. Numeral 50 designates a horizontal clock terminal, numeral 51 a vertical clock terminal, numeral 52 an output horizontal shift register, numeral 53 a vertical transfer gate, numeral 54 a vertical analog shift register, and number 55 a portion of a picture element in which a diffused region and a MOS FET switch with its source being the afoesaid diffused region are combined.

Figure 17:
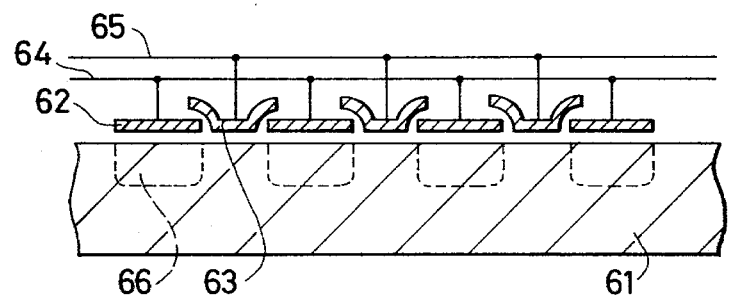
FIG. 17 is a sectional view of a CCD transfer region.
Figure 18:
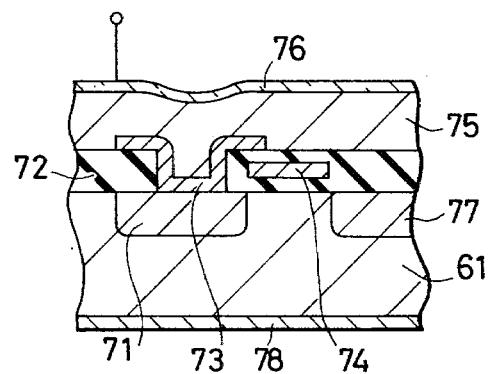
FIG. 18 is a sectional view of a light receiving portion.

FIG. 17 is a sectional view of a CCD transfer region (a sectional view taken along, for example, A—A' in FIG. 16), and FIG. 18 is a sectional view of the portion of the picture element (a sectional view taken along, for example, B—B' in FIG. 16).

In FIG. 17, electrodes 62 and 63 are formed on an Si substrate 61 through an insulating layer, and clock voltages in two phases are respectively applied thereto through lines 64 and 65. Thus, a potential well within the Si substrate moves to transfer charges. FIG. 18 is the sectional view of the light receiving region, i. e., the portion of the picture element, in which numeral 71 designates a diffused layer, numeral 72 an insulating layer, numeral 73 a metal electrode, numeral 74 a gate electrode, numeral 75 a photoconutive film, numeral 76 a transparent electrode, 77 an another diffusion region, and 78 an another electrode. The CCD transfer region shown in FIG. 17 is connected to the light receiving region The transparent electrode 76, the photoconductive film 75 and the metal electrode 73 form a photosensitive portion. A switching region which moves carriers induced in the photosensitive portion to the transfer portion is a portion having the gate 74, which forms a substantial MOS FET switch.

The Si substrate formed with the CCD transfer region and the MOS FET switch portion was prepared, and was set in the magnetron type sputtering equipment. The atmosphere was a mixed gas consisting of Ar and hydrogen and being under 0.2 Torr. The hydrogen content was 6 mol-%. A sputter target was made of silicon.

The various constituents to be constructed on the Si substrate, that is, the CCD transfer region, the MOS FET switch region, etc may be fabricated by processes having hitherto been known.

The reactive sputtering was executed under conditions of a frequency of 13.56 MHz and an input of 300 W, to deposit the thin film of the amorphous material 75 containing hydrogen in the photosensitive region of the Si substrate to a thickness of 500 nm. The hydrogen content of the amorphous material was 20 atomic-%, and the resistivity was $5 \times 10^{13}$ Ω·cm. The In$_2$O$_3$ Nesa electrode was formed on the amorphous material. Cr-Au was deposited on parts of the Nesa electrode to form bias electrode by the evaporation throught the mask and wire were bonded there.

The operation will be briefly explained with reference to FIG. 16. When light has fallen on the photosensitive portion through the transparent electrode, carriers induced by the photo signal are shifted to the vertical analog shift register 54 by applying a voltage to the gate electrode between the diffused region in the photosensitive region 55 and the vertical shift register 54. The vertical shift CCD is driven through the 2-phase vertical clock terminals 51, and signals of each column of the photosensitive portions are transmitted to the output horizontal shift register 52 through the vertical transfer gate 53. The horizontal shift register is also the CCD which is driven through the 2-phase horizontal clock terminals 50, and it transfers the charge corresponding to the signal towards an output terminal so as to deliver them out as a signal output. The frequency of the 2-phase drive may be selected so that the shift of the horizontal shift register may be completed within the period of the voltage pulses applied to the vertical transfer gate.

The imaging devices of this invention described in connection with the foregoing examples have such features as good matching of the spectral response with the visibility, good sensitivity and noise characteristics, high resolution, and non-existence of blooming. Besides, they have such features as low power dissipation, small size, light weight, and high reliability. Therefore, the industrial effects are very great.

What is claimed is:

1. In a solid-state imaging device having a plurality of photosensitive regions and a semiconductor substrate which includes at least one scanning means for scanning the photosensitive regions, the photosensitive regions including at least a layer of a photosensitive material extending over the semiconductor substrate and a transparent electrically conductive film extending over the photosensitive material layer; the solid-state imaging device being characterized in that the photosensitive material is an amorphous material containing at least 50 atomic-% of silicon and 5 to 50 atomic % of hydrogen and having a dark resistivity that is not lower than $10^{10}$ Ω·cm.

2. A solid-state imging device according to claim 1, wherein the photosensitive material layer is formed by reactive sputtering in an atmosphere which contans hydrogen.

3. A solid-state imaging device according to claim 1, wherein the photosensitive material layer is formed by a glow discharge process in an atmosphere which contains at least silane.

4. A solid-state imaging device according to claim 1, wherein said scanning means for scanning the photosensitive regions comprise at least one field-effect transistor.

5. A solid-state imaging device according to claim 1, wherein the semiconductor substrate is divided into cells in which field-effect transistors are formed, and said layer of a photosensitive material is disposed in electrical contact with source electrodes (or drain electrodes) of the field-effect transistors, the cells being arranged in two dimensions in correspondence with individual picture elements; a common connection line connected in common to the gate electrodes of the field-effect transistors in each column (or row) in the two-dimensional arrangement so as to scan the column (or row); a common connection line connected in common to the drain electrodes (or source) electrodes of the field-effect transistors in each row (or column) so as to scan the row (or column); and common output means connected to the common connection line of the drain electrodes (or source electrodes) for successively taking out electric signals from the cells corresponding to the respective picture elements.

6. A solid-state imaging device according to claim 1, wherein the semiconductor substrate is divided into cells in each of which a charge coupled device is formed, the cells corresponding to individual picture elements; electric signals from the respective picture elements and being transferred to the charge coupled device and thereafer taken out successively.

7. A solid-state imaging device according to claim 1, 2, 3, 4, 5, or 6, wherein the hydrogen content of said amorphous material is 5 atomic-% to 30 atomic-%.

8. A solid-state imaging device according to claim 1, 2, 3, 4, 5 or 6, wherein the hydrogen content of said amorphous material is 10 atomic-% to 25 atomic-%.

9. A solid-state imaging device according to claim 1, 2, 3, 4, 5 or 6, wherein a part of silicon in said amorphous material is substituted by germanium or carbon within 30 atomic-%.

10. A solid-state imaging device according to claim 7, wherein a part of silicon in said amorphous material is substituted by germanium or carbon within 30 atomic-%.

11. A solid-state imaging device according to claim 1, 2, 3, 4, 5 or 6, wherein an insulator layer and the photosensitive material layer are arranged on the semiconductor substrate having the at least one scanning means for scanning the photosensitive portions and are overlaid by the transparent conductive film, and at least the scanning means and the photoelectric material layer are electrically connected.

* * * * *